United States Patent
Kakemizu et al.

(10) Patent No.: US 6,728,926 B1
(45) Date of Patent: Apr. 27, 2004

(54) ENCODING RATE DETECTION METHOD AND ENCODING RATE DETECTION DEVICE

(75) Inventors: Takashi Kakemizu, Joyo (JP); Takehiro Kamada, Ibaraki (JP); Yuji Nakai, Hirakata (JP)

(73) Assignee: Matsushita Electric Industrial Co., Ltd., Kadoma (JP)

(*) Notice: Subject to any disclaimer, the term of this patent is extended or adjusted under 35 U.S.C. 154(b) by 480 days.

(21) Appl. No.: 09/831,636

(22) PCT Filed: Jun. 27, 2000

(86) PCT No.: PCT/JP00/04220
§ 371 (c)(1),
(2), (4) Date: May 11, 2001

(87) PCT Pub. No.: WO01/01580
PCT Pub. Date: Apr. 1, 2001

(30) Foreign Application Priority Data

Jun. 29, 1999 (JP) .......................... 11-182829

(51) Int. Cl.$^7$ .............................................. H03M 13/00
(52) U.S. Cl. ................................ 714/789; 375/225
(58) Field of Search ........................ 714/705, 704, 714/789, 795, 796; 375/225, 341, 364; 370/503, 516

(56) References Cited

U.S. PATENT DOCUMENTS

| | | | |
|---|---|---|---|
| 4,578,800 A | 3/1986 | Yasuda et al. | 375/354 |
| 4,802,174 A | 1/1989 | Hiraiwa et al. | 714/789 |
| 5,563,912 A * | 10/1996 | Yasunaga et al. | 375/342 |
| 5,809,044 A | 9/1998 | Todoroki | 714/786 |
| 5,937,016 A | 8/1999 | Choi | 375/341 |
| 6,463,097 B1 * | 10/2002 | Held et al. | 375/225 |
| 6,567,466 B1 * | 5/2003 | Ovalekar et al. | 375/225 |

FOREIGN PATENT DOCUMENTS

| | | |
|---|---|---|
| GB | 2 316 585 A | 2/1998 |
| JP | 06260945 | 9/1994 |
| JP | 6-276107 | 9/1994 |
| JP | 09051278 | 2/1997 |
| JP | 09135177 | 5/1997 |
| JP | 9-181619 | 7/1997 |
| JP | 10-93530 | 4/1998 |
| JP | 2786342 | 5/1998 |
| JP | 10145245 | 5/1998 |

* cited by examiner

Primary Examiner—Phung M. Chung
Assistant Examiner—Shelly A Chase
(74) Attorney, Agent, or Firm—McDermott Will & Emery

(57) ABSTRACT

In accordance with a rate detecting method for detecting a predetermined rate at which a received signal has been coded, the coded signal is decoded based on a first synchronizing signal having a frequency corresponding to a first rate such that a first decoded signal (ST11) is generated and then it is judged whether or not synchronization is determined for the first decoded signal (ST12). If the synchronization cannot be determined, there is generated only a second synchronizing signal having a frequency corresponding to a second rate having a difference between itself and a first rate which is smaller than a permissible value of the rate determined by the lower and upper values of the rate (ST13, ST17).

8 Claims, 3 Drawing Sheets

ENCODING RATE DETECTION METHOD AND ENCODING RATE DETECTION DEVICE

TECHNICAL FIELD

The present invention relates to a rate detecting method and a rate detecting apparatus each for detecting, upon receipt of a signal coded at a predetermined rate, the rate of the coded signal that has been received.

BACKGROUND ART

In the field of digital CS broadcasting or the like, a Viterbi decoding method has been used as one of convolutional decoding methods. If a coded signal is received and the rate r ($m \leq r \leq n$ where m represents a minimum value and n represents a maximum value) of the received signal is unknown to the receiving side, the rate r has been detected conventionally by determining the synchronization of the coded signal by using a Viterbi decoder. In this case, it is sensed whether or not the synchronization can be determined by sequentially varying the frequency of a clock signal for determining the synchronization from the minimum value m of the coded signal to the maximum value n thereof in the receiving apparatus. If the synchronization cannot be determined even when the clock signal reaches the frequency corresponding to the maximum value n of the rate, the clock signal is reset to the frequency corresponding to the minimum value m of the rate and it is judged again whether or not the synchronization can be determined. The foregoing process is repeatedly performed till the synchronization is determined.

In the conventional rate detecting method and apparatus, however, digital noise arises due to a significant change in the frequency of the clock signal which occurs when the clock signal is reset from the frequency corresponding to the maximum value n of the rate to the frequency corresponding to the minimum value m thereof. If the rate detecting apparatus and an analog circuit are integrated in a single substrate as a semiconductor integrated circuit, the problem is encountered that the digital noise adversely affects the performance characteristics of the semiconductor integrated circuit.

DISCLOSURE OF THE INVENTION

It is therefore an object of the present invention to solve the foregoing problem and suppress the digital noise which arises when the synchronizing signal is changed.

To attain the object, the present invention reduces, when the synchronization of the coded signal that has been received is to be determined, the difference between a rate for synchronization determination and another different rate such that it is smaller than a permissible value of the rate determined by the lower and upper limit values of the coded signal that has been received.

Specifically, a rate detecting method according to the present invention assumes a rate detecting method for detecting, in a signal that has been coded at a predetermined rate, the predetermined rate of the coded signal, the method comprising: a first synchronizing signal generating step of generating a first synchronizing signal having a frequency corresponding to a first rate between lower and upper limit values of the rate; a first decoded signal generating step of decoding the coded signal based on the first synchronizing signal to generate a first decoded signal; a first synchronization determining step of determining whether or not desired synchronization is obtainable for the first decoded signal; a second synchronizing signal generating step of generating, if the synchronization of the coded signal is not obtainable in the first synchronization determining step, only a second synchronizing signal having a frequency corresponding to a second rate having a difference between itself and the first rate which is smaller than a permissible value of the rate determined by the lower and upper limit values; a second decoded signal generating step of decoding the coded signal based on the second synchronizing signal to generate a second decoded signal; a second synchronization determining step of determining whether or not the desired synchronization is obtainable for the second decoded signal; and a reiterating step of reiterating, if the synchronization of the coded signal is not obtainable in the second synchronization determining step, the second decoded signal generating step and the second synchronization determining step till the synchronization of the coded signal is obtained, while changing the frequency of the second synchronizing signal such that it is smaller than the permissible value.

In accordance with the rate detecting method of the present invention, only the second synchronizing signal having the frequency corresponding to the second rate having the difference between itself and the first rate which is smaller than the permissible value of the rate is generated in the second synchronizing signal generating step. Accordingly, the difference between the frequency of the first synchronizing signal and the frequency of the second synchronizing signal is reduced to be smaller than the permissible value of the rate determined by the lower and upper limit values, which suppresses digital noise arising when switching is performed from the frequency of the first synchronizing signal to the frequency of the second synchronizing signal.

In the rate detecting method of the present invention, the first decoded signal generating step or the second decoded signal generating step preferably includes the step of decoding the coded signal by using a Viterbi decoding method. This ensures decoding of the coded signal actually (commercially) used.

In the rate detecting method of the present invention, the reiterating step preferably includes the step of changing the frequency of the second synchronizing signal such that it increases stepwise and changing, if the frequency after the change is over the upper limit value of the rate, changing the frequency of the second synchronizing signal such that it decreases stepwise. This allows the reiterating process to be performed positively without changing the frequency in a single step to the lower limit value of the rate if the frequency after the change is over the upper limit value of the rate.

In the rate detecting method of the present invention, the reiterating step preferably includes the step of changing the frequency of the second synchronizing signal such that it decreases stepwise and changing, if the frequency after the change is under the lower limit value of the rate, changing the frequency of the second synchronizing signal such that it increases stepwise. This allows the reiterating process to be performed positively without changing the frequency in a single step to the upper limit value of the rate if the frequency after the change is under the lower limit value of the rate.

A rate detecting apparatus according to the present invention assumes a rate detecting apparatus for detecting, in a signal that has been coded at a predetermined rate, the predetermined rate of the coded signal, the apparatus comprising: a decoding circuit for receiving the coded signal and decoding the coded signal that has been received to output a decoded signal; a synchronizing signal generating circuit for generating a synchronizing signal used to perform synchronization determination with respect to the decoded signal and outputting the synchronizing signal to the decoding circuit; and a synchronization detecting circuit for receiving the decoded signal, performing predetermined synchronization determination with respect to the decoded signal that has been received, and outputting, if the synchronization has not been determined, a frequency switching signal for switching a frequency of the synchronizing signal to the synchronizing signal generating circuit, the synchronizing signal generating circuit generating, based on the frequency switching signal, only a first synchronizing signal having a frequency corresponding to a first rate between lower and upper limit values of the rate in the coded signal and a second synchronizing signal having a frequency corresponding to a second rate having a difference between itself and the first rate which is smaller than a permissible value determined by the lower and upper limit values.

In the rate detecting apparatus of the present invention, only the first synchronizing signal having the frequency corresponding to the first rate between the lower and upper limit values of the rate in the coded signal and the second synchronizing signal having the frequency corresponding to the second rate having the difference between itself and the first rate which is smaller than the permissible value of the rate are generated. Accordingly, the difference between the frequency of the first synchronizing signal and the frequency of the second synchronizing signal is smaller than the permissible value of the rate determined by the lower and upper limit values, which suppresses digital noise arising when switching is performed from the frequency of the first synchronizing signal to the frequency of the second synchronizing signal. Even if the apparatus according to the present invention has another circuit adjacent the peripheral portion thereof, the performance characteristics of the adjacent circuit are not affected thereby.

In the rate detecting apparatus of the present invention, the decoding circuit is preferably a Viterbi decoding circuit for performing decoding in accordance with a Viterbi decoding method. This ensures decoding of an actually used coded signal.

In the rate detecting apparatus of the present invention, the synchronizing signal generating circuit preferably changes the frequency of the second synchronizing signal such that it increases stepwise and changes, if the frequency after the change is over the upper limit value of the rate, the frequency of the second synchronizing signal such that it decreases stepwise. This allows the reiterating process to be performed positively without changing the frequency in a single step to the lower limit value of the rate if the frequency after the change is over the upper limit value of the rate.

In the rate detecting apparatus of the present invention, the synchronizing signal generating circuit preferably changes the frequency of the second synchronizing signal such that it decreases stepwise and changes, if the frequency after the change is under the lower limit value of the rate, the frequency of the second synchronizing signal such that it increases stepwise. This allows the reiterating process to be performed positively without changing the frequency in a single step to the upper limit value of the rate if the frequency after the change is under the lower limit value of the rate.

BEST MODE FOR CARRYING OUT THE INVENTION

Figure 1:
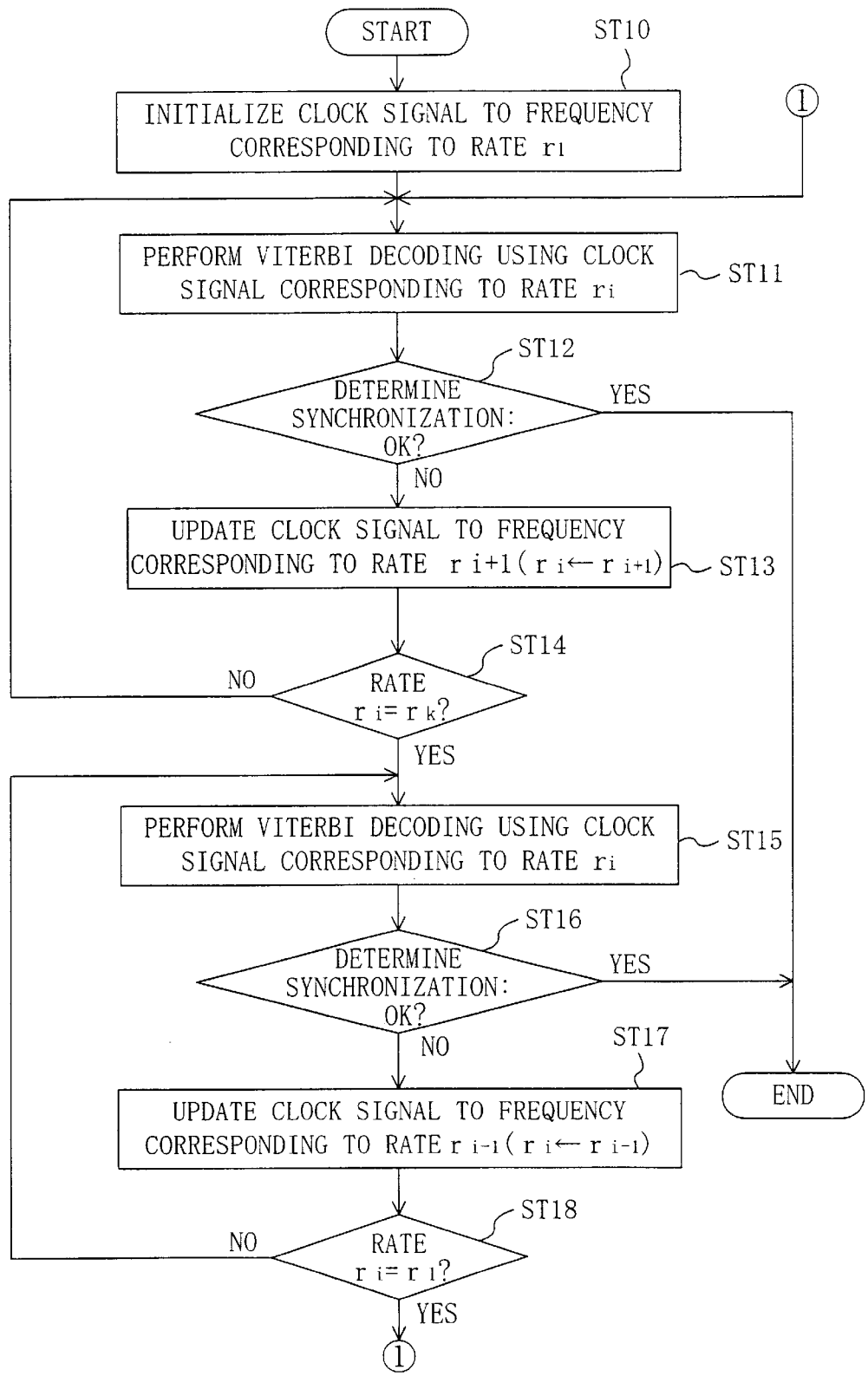
FIG. 1 is a flow chart illustrating a rate detecting method according to an embodiment of the present invention.

Referring now to the drawings, an embodiment of the present invention will be described.

FIG. 1 is a flow chart illustrating a rate detecting method according to the embodiment.

The present invention assumes that, when a signal to be transmitted signal is coded in digital communication such as digital broadcasting, a specific one is not selected from a plurality of rates r prepared. Therefore, it is necessary for the receiving side to detect the rate at which the transmitted signal is coded and determine synchronization for the digital communication.

As examples of synchronization determining methods, there are a method of detecting a synchronization code and a method of using a path metric. In accordance with the method of detecting the synchronization code, a synchronization code having a given bit length (e.g., 8-bit "01000111" in the case of MPEG) is inserted in a plurality of portions of the coded signal and, if the synchronization code has been detected a specified number of times, it is assumed that the synchronization has been determined. The method of using the path metric is a Viterbi decoding method. In accordance with the method, the path metric of the coded signal that has been received is observed and, if the value of the observed path metric is smaller than a predetermined threshold value, it is assumed that the synchronization has been determined.

Besides the two methods, there is also a method of assuming that the synchronization has been determined if the operating state of an apparatus or a program after the received signal is fetched is recognized to be normal.

A description will be given herein below to an exemplary method using the Viterbi decoding method wherein, when coded data with a rate $r_i$ ($1 \leq i \leq k$ where i is a positive integer and k is an integer equal to or more than 3) is received and decoded, the rate $r_i$ which allows the result of synchronization determination to be true is detected. It is assumed that the magnitude of the rate $r_i$ satisfies $r_1 < r_i < r_k$.

First, as shown in FIG. 1, a clock signal as a synchronizing signal having a frequency corresponding to the minimum value $r_1$ of the rate is selected in an initial rate setting step ST10.

Then, in a first Viterbi decoding step ST11, a coded signal that has been received is decoded by using the selected clock signal.

Then, in a first synchronization determining step ST12, synchronization determination is performed with respect to the decoded signal. If a path metric is smaller than a threshold value, it is judged that the synchronization has been determined, whereby the whole process is completed.

If the synchronization has not been determined, a clock signal having a frequency corresponding to a rate $r_{i+1}$ is selected in a first clock signal updating step ST13.

Next, if the rate $r_i$ is not the maximum value $r_k$ thereof, the whole process returns to the first Viterbi decoding step ST11 where it is continued.

Next, if the rate $r_{i+1}$ is the maximum value $r_k$ thereof, the coded signal is decoded by using the selected clock signal in a second Viterbi Decoding Step ST15.

Next, in a second synchronization determining step ST16, synchronization determination is performed with respect to the decoded signal and, if it is judged that the synchronization has been determined, the whole process is completed.

If the synchronization has not been determined, a clock signal having a frequency corresponding to the rate $r_{i-1}$ is selected in a second clock signal updating step ST17.

Next, if the rate $r_i$ is not the minimum value $r_1$ thereof in a minimum rate determining step ST18, the whole process returns to the second Viterbi decoding step ST15 where it is continued. If the rate $r_i$ is the minimum value $r_1$ thereof, the whole process returns to the first Viterbi decoding step ST11 where it is continued. The foregoing process is repeatedly performed till the result of synchronization determination is judged to be true.

Thus, in the rate detecting method according to the present embodiment, synchronization determination is performed by switching between the corresponding frequencies of the clock signals in such a manner as to reciprocate between the minimum and maximum values $r_1$ and $r_k$ of the rate. Since only the clock signals having variations smaller than a permissible value of the rate determined by the minimum and maximum values $r_1$ and $r_k$ are generated without jumping in a single step from the minimum value generating frequency corresponding to the minimum value $r_1$ of the rate to the maximum value generating frequency corresponding to the maximum value $r_k$ thereof and skipping the in-between frequencies, digital noise arising in switching the frequency of the clock signal can be suppressed significantly.

Although the present embodiment has used the Viterbi decoding method as a decoding process, another decoding method compatible with the method in which the signal has been coded may be used appropriately.

Even if a clock signal as a synchronizing signal having a frequency corresponding to the maximum value $r_k$ of the rate is selected in the initial rate setting step ST10, an equal detection result can be obtained. In this case, however, the whole process is started appropriately in the second Viterbi decoding step ST15.

It is also possible to assume a clock signal corresponding to an intermediate value $r_i$ between the minimum and maximum values $r_1$ and $r_k$ to be an initial value.

Herein below, a description will be given to a rate detecting apparatus which implements the rate detecting method according to the present embodiment.

Figure 2:
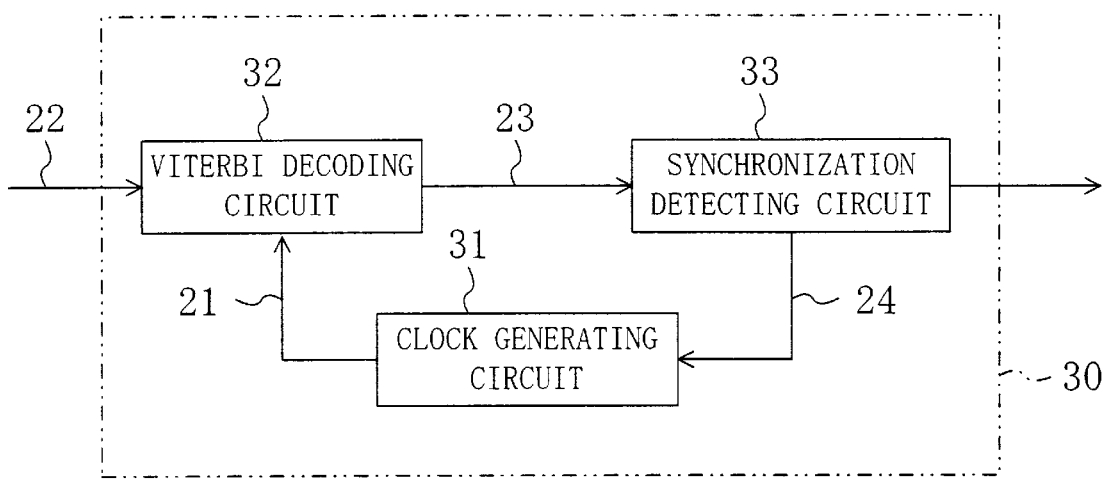
FIG. 2 is a functional block diagram showing a rate detecting apparatus according to the embodiment.

FIG. 2 shows a functional structure of the rate detecting apparatus according to the present embodiment. As shown in FIG. 2, a rate detecting apparatus 30 comprises: a clock generating circuit 31 as a circuit for generating and outputting a clock signal 21 as as a synchronizing signal; a Viterbi decoding circuit 32 for performing Viterbi decoding with respect to a coded signal 22 inputted thereto based on the clock signal 21 and outputting a decoded signal 23; and a synchronization detecting circuit 33 for receiving the decoded signal 23, performing synchronization determination with respect to the received decoded signal 23 by observing a path metric, and outputting a clock switching signal 24 as a frequency switching signal for switching the frequency of the clock signal 21 to the clock generating circuit 31 if synchronization has not been determined.

Figure 3:
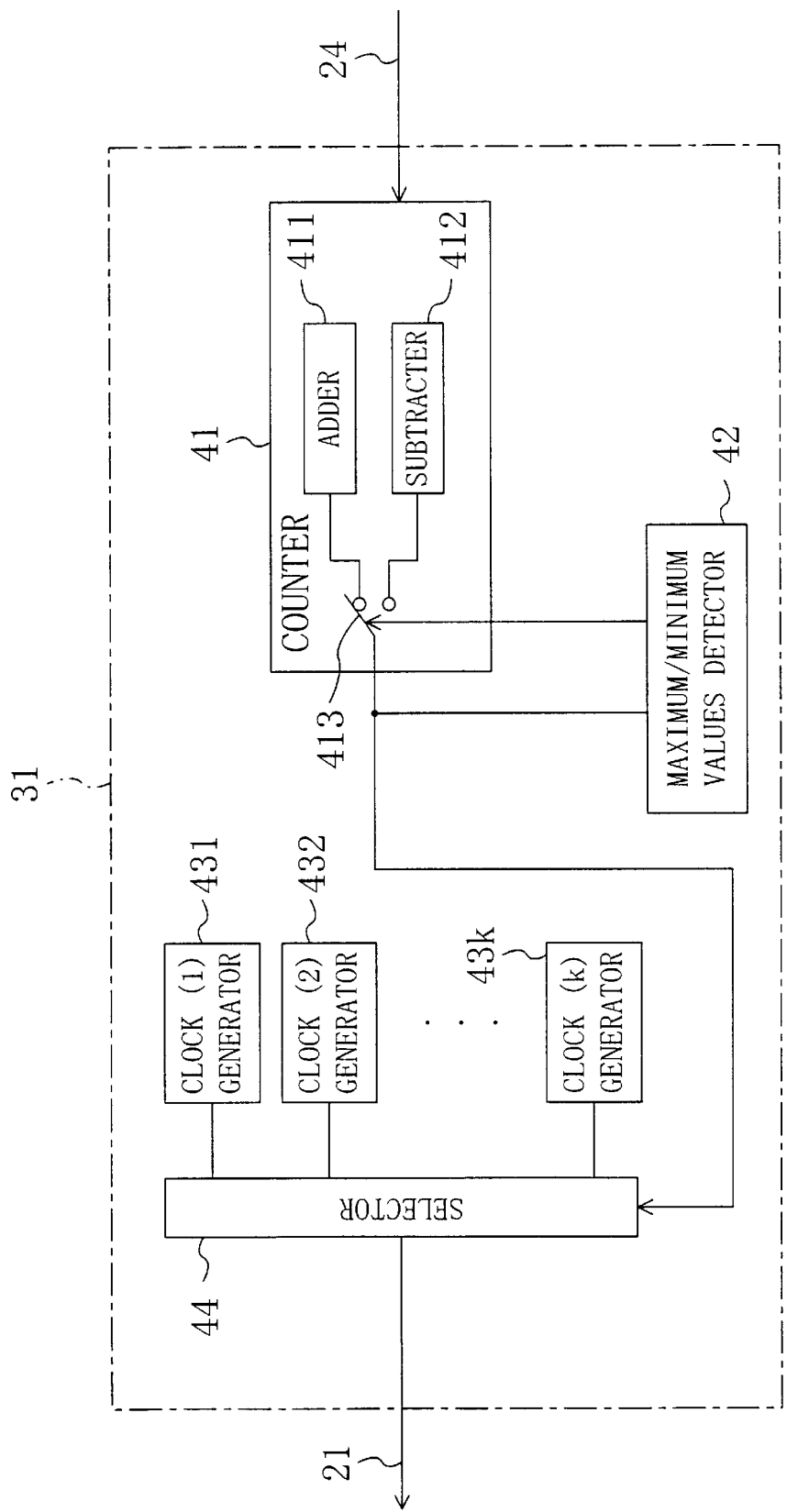
FIG. 3 is a functional block diagram showing a clock generating circuit in the rate detecting apparatus according to the embodiment.

FIG. 3 shows a functional structure of the clock generating circuit 31 according to the present embodiment. As shown in FIG. 3, the clock generating circuit 31 is composed of: a counter 41 for increasing or decreasing the rate $r_i$ based on the clock switching signal 24; a maximum/minimum values detector 42 for sensing whether or not the frequency of a signal outputted from the counter 41 is the maximum (upper limit) value or the minimum (lower limit) value of the counter; a plurality of clock generators 431 to 43$k$ for generating and outputting frequencies different from each other; and a selector 44 for selecting among respective output signals from the plurality of clock generators 431 to 43$k$ based on an output signal from the counter 41.

The counter 41 has: an adder 411 for adding 1 to the value of i of the rate $r_i$ to be detected every time the clock switching signal 24 is inputted thereto; a subtracter 412 for subtracting 1 from the value of i of the rate $r_i$ every time the clock switching signal 24 is inputted thereto; and a switch 413 for switching between the respective output signals from the adder 411 and the subtracter 412.

A description will be given below to the operation of the rate detecting apparatus thus constituted.

It is assumed here that the rate $r_i$ of the coded signal 22 that has been received is determined at the k stages of $r_1 < r_i < r_k$. Accordingly, the clock generators 431 to 43$k$ in the clock generating circuit 31 generate the frequencies ($f_1 \leq f_i \leq f_k$) of the clock signal 21 which correspond to the rates $r_i$.

First, as shown in FIG. 3, the initial value is assumed to be 1 in the counter 41 of the clock generating circuit 31 and the switch 413 is connected to the adder 411.

Then, the selector 44 selects the clock signal from the clock generator 431 based on an instruction given by the counter 41.

Next, as shown in FIG. 2, the decoding circuit 32 performs Viterbi decoding with respect to the coded signal 22 that has been received based on the clock signal 21 inputted thereto and outputs the decoded signal 23 to the synchronization detecting circuit 33. Upon receipt of the decoded signal 23, the synchronization detecting circuit 33 performs predetermined synchronization determination and outputs, if synchronization can not be determined, the clock switching signal 24 for switching the frequency of the clock signal 21 to the clock generating circuit 31.

Next, the counter 41 that has received the clock switching signal 24 adds only one to the value in the adder 411. Then, if the value of i of the rate $r_i$ reaches k as the maximum value, the maximum/minimum values detector 42 switches the connection of the switch 413 to an output terminal of the subtracter 412. If the value of i of the rate $r_i$ reaches 1 as the minimum value, the switch 413 is connected to an output terminal of the adder 411.

Since the clock signal 21 is switched only between the frequencies adjacent to each other, the k clock generators 431 to 43$k$ generate only the clock signals having variations smaller than the permissible value of the rate determined by the minimum and maximum values $r_1$ and $r_k$ without jumping in a single step from the frequency generated by the clock generator 431 corresponding to the minimum value $r_1$ of the rate to the frequency generated by the clock generator 43$k$ corresponding to the maximum value $r_k$ of the rate and skipping the in-between values. This significantly suppresses the digital noise arising when the frequency of the clock signal is switched so that, even if the rate detecting circuit according to the present embodiment and an analog circuit are mixedly integrated, the performance characteristics of the analog circuit are no more affected thereby.

Although the Viterbi decoding circuit 32 has been used as a decoding circuit, a decoding circuit compatible with the method in which the signal has been coded may be used appropriately.

If the initial value is set to k in initializing the counter 41 and a connection is provided between the switch 413 and the subtracter 412, synchronization determination can be performed starting from the maximum value $r_k$ of the rate which decreases stepwise.

What is claimed is:

1. A rate detecting method for detecting, in a signal that has been coded at a predetermined rate, the predetermined rate of the coded signal, the method comprising:

a first synchronizing signal generating step of generating a first synchronizing signal having a frequency corresponding to a first rate between lower and upper limit values of the rate;

a first decoded signal generating step of decoding the coded signal based on the first synchronizing signal to generate a first decoded signal;

a first synchronization determining step of determining whether or not desired synchronization is obtainable for the first decoded signal;

a second synchronizing signal generating step of generating, if the synchronization of the coded signal is not obtainable in the first synchronization determining step, only a second synchronizing signal having a frequency corresponding to a second rate having a difference between itself and the first rate which is smaller than a permissible value of the rate determined by the lower and upper limit values;

a second decoded signal generating step of decoding the coded signal based on the second synchronizing signal to generate a second decoded signal;

a second synchronization determining step of determining whether or not the desired synchronization is obtainable for the second decoded signal; and a reiterating step of reiterating, if the synchronization of the coded signal is not obtainable in the second synchronization determining step, the second decoded signal generating step and the second synchronization determining step till the synchronization of the coded signal is obtained, while changing the frequency of the second synchronizing signal such that it is smaller than the permissible value.

2. The method of claim 1, wherein the first decoded signal generating step or the second decoded signal generating step includes the step of decoding the coded signal by using a Viterbi decoding method.

3. The method of claim 1, wherein the reiterating step includes the step of changing the frequency of the second synchronizing signal such that it increases stepwise and changing, if the frequency after the change is over the upper limit value of the rate, changing the frequency of the second synchronizing signal such that it decreases stepwise.

4. The method of claim 1, wherein the reiterating step includes the step of changing the frequency of the second synchronizing signal such that it decreases stepwise and changing, if the frequency after the change is under the lower limit value of the rate, changing the frequency of the second synchronizing signal such that it increases stepwise.

5. A rate detecting apparatus for detecting, in a signal that has been coded at a predetermined rate, the predetermined rate of the coded signal, the apparatus comprising:

a decoding circuit for receiving the coded signal and decoding the coded signal that has been received to output a decoded signal;

a synchronizing signal generating circuit for generating a synchronizing signal used to perform synchronization determination with respect to the decoded signal and outputting the synchronizing signal to the decoding circuit; and a synchronization detecting circuit for receiving the decoded signal, performing predetermined synchronization determination with respect to the decoded signal that has been received, and outputting, if the synchronization has not been determined, a frequency switching signal for switching a frequency of the synchronizing signal to the synchronizing signal generating circuit, the synchronizing signal generating circuit generating, based on the frequency switching signal, only a first synchronizing signal having a frequency corresponding to a first rate between lower and upper limit values of the rate in the coded signal and a second synchronizing signal having a frequency corresponding to a second rate having a difference between itself and the first rate which is smaller than a permissible value determined by the lower and upper limit values.

6. The apparatus of claim 5, wherein the decoding circuit is a Viterbi decoding circuit for performing decoding in accordance with a Viterbi decoding method.

7. The apparatus of claim 5, wherein the synchronizing signal generating circuit changes the frequency of the second synchronizing signal such that it increases stepwise and changes, if the frequency after the change is over the upper limit value of the rate, the frequency of the second synchronizing signal such that it decreases stepwise.

8. The apparatus of claim 5, wherein the synchronizing signal generating circuit changes the frequency of the second synchronizing signal such that it decreases stepwise and changes, if the frequency after the change is under the lower limit value of the rate, the frequency of the second synchronizing signal such that it increases stepwise.

* * * * *

UNITED STATES PATENT AND TRADEMARK OFFICE
CERTIFICATE OF CORRECTION

PATENT NO. : 6,728,926 B1
DATED : April 27, 2004
INVENTOR(S) : Takashi Kakemizu et al.

It is certified that error appears in the above-identified patent and that said Letters Patent is hereby corrected as shown below:

Title page,
Item [87], PCT Pub. Date, change "Apr. 1, 2001" to -- Jan. 4, 2001 --

Signed and Sealed this

Twenty-eighth Day of December, 2004

JON W. DUDAS
*Director of the United States Patent and Trademark Office*